(12) United States Patent
Ying et al.

(10) Patent No.: US 10,916,286 B2
(45) Date of Patent: Feb. 9, 2021

(54) ASSISTED WRITE METHOD FOR MRAM TESTING AND FIELD APPLICATIONS

(71) Applicant: TAIWAN SEMICONDUCTOR MANUFACTURING CO., LTD., Hsinchu (TW)

(72) Inventors: Ji-Feng Ying, Hsinchu (TW); Jhong-Sheng Wang, Taichung (TW); Duen-Huei Hou, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/428,551

(22) Filed: May 31, 2019

(65) Prior Publication Data

US 2020/0058340 A1 Feb. 20, 2020

Related U.S. Application Data

(60) Provisional application No. 62/719,286, filed on Aug. 17, 2018.

(51) Int. Cl.
*G11C 11/00* (2006.01)
*G11C 11/16* (2006.01)
(Continued)

(52) U.S. Cl.
CPC ........ *G11C 11/1675* (2013.01); *G11C 11/161* (2013.01); *G11C 11/1673* (2013.01);
(Continued)

(58) Field of Classification Search
CPC . G11C 11/167; G11C 11/161; G11C 11/1673; G11C 11/1655; G11C 11/1657
See application file for complete search history.

(56) References Cited

U.S. PATENT DOCUMENTS

| 7,012,841 B1* | 3/2006 | Nahas | G11C 5/147 365/189.09 |
|---|---|---|---|
| 7,480,172 B2* | 1/2009 | Shi | G11C 11/16 365/158 |

(Continued)

FOREIGN PATENT DOCUMENTS

| CN | 100347785 C | 11/2007 |
|---|---|---|
| JP | 2009245500 A | 10/2009 |

OTHER PUBLICATIONS

Chen Wang, Ph.D., "Characterization of Spin Transfer Torque and Magnetization Manipulation in Magnetic Nanostructures," Cornell University 2012.
(Continued)

*Primary Examiner* — Pho M Luu
(74) *Attorney, Agent, or Firm* — McDermott Will & Emery LLP

(57) ABSTRACT

A method of writing to a magnetic random access memory cell includes applying an alternating current signal to the magnetic random access memory cell having a first magnetic orientation, and applying a direct current pulse to the magnetic random access memory cell to change the magnetic orientation of the magnetic random access memory cell from the first magnetic orientation to a second magnetic orientation. The first magnetic orientation and the second magnetic orientation are different.

20 Claims, 14 Drawing Sheets

(51) Int. Cl.
*H01F 10/32* (2006.01)
*H01L 21/66* (2006.01)
*H01L 43/02* (2006.01)
*H01L 43/12* (2006.01)

(52) U.S. Cl.
CPC ......... *H01F 10/3254* (2013.01); *H01L 22/14* (2013.01); *H01L 43/02* (2013.01); *H01L 43/12* (2013.01); *G11C 11/1655* (2013.01); *G11C 11/1657* (2013.01); *H01F 10/329* (2013.01); *H01F 10/3286* (2013.01)

(56) References Cited

U.S. PATENT DOCUMENTS

| | | | |
|---|---|---|---|
| 8,451,655 B2 * | 5/2013 | Chung | G11C 11/1677 365/158 |
| 10,249,352 B2 * | 4/2019 | Takaya | G11C 7/1069 |
| 2002/0083280 A1 | 6/2002 | Naitoh et al. | |
| 2004/0090835 A1 | 5/2004 | Miyatake et al. | |
| 2005/0133822 A1 | 6/2005 | DeHerrera et al. | |
| 2007/0047294 A1 | 3/2007 | Panchula | |

OTHER PUBLICATIONS

Professor A. Mason, "Memory Basics," Michigan State University, Lecture Notes, 13.1-13.34, Retrieved from the internet on May 30, 2019, from https://www.egr.msu.edu/classes/ece410/mason/files/Ch13.pdf.

SDRAM Technology "What are bit-lines and word-lines on a SDRAM chip?" Retrieved from the internet on Aug. 29, 2018 from http://www.sdram-technology.info/bitlines-wordlines.html.

* cited by examiner

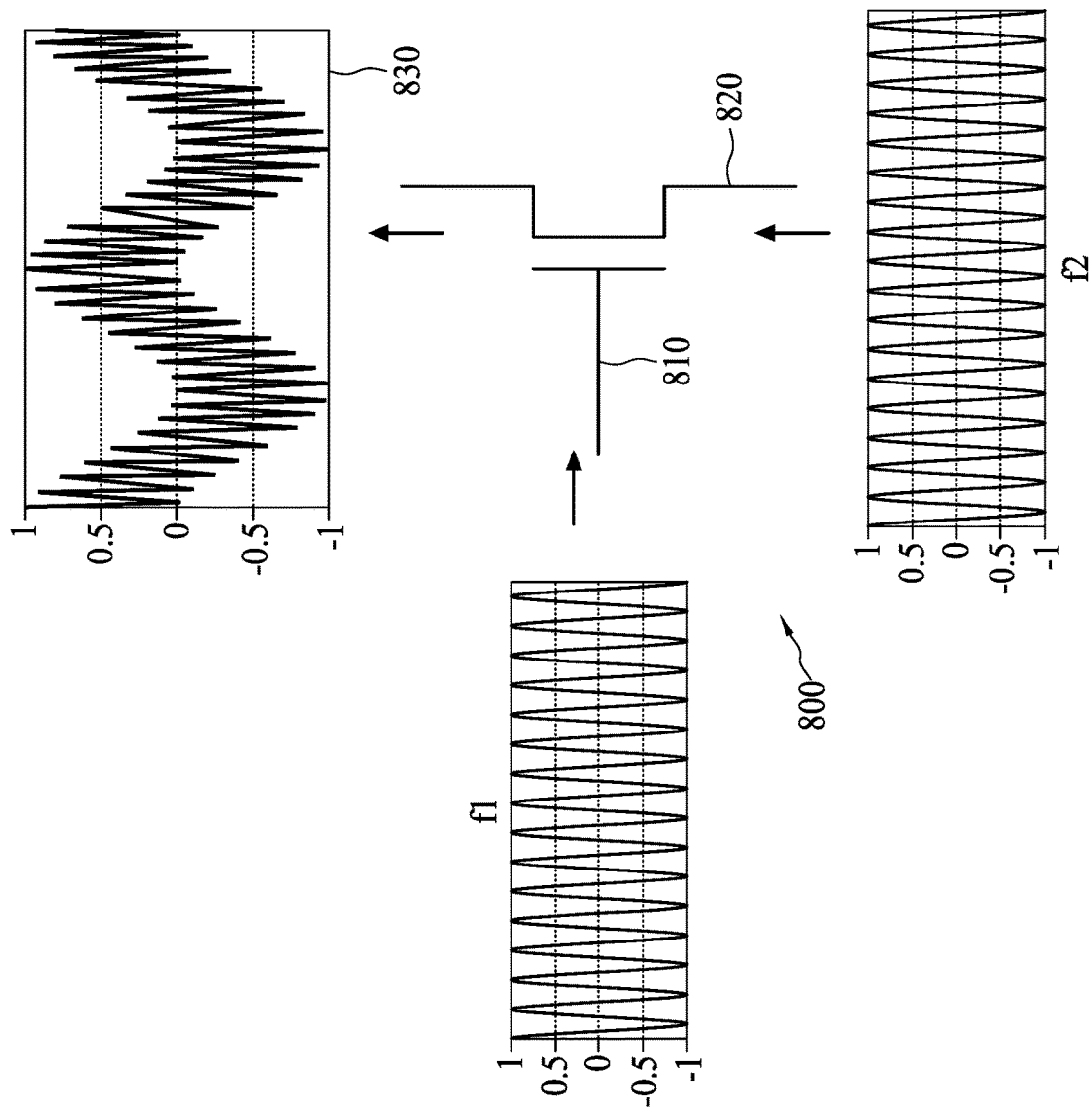

ASSISTED WRITE METHOD FOR MRAM TESTING AND FIELD APPLICATIONS

CROSS-REFERENCE TO RELATED APPLICATION

This application claims priority to U.S. Provisional Patent Application No. 62/719,286, filed Aug. 17, 2018, the entire disclosure of which is incorporated herein by reference.

BACKGROUND

A magnetic random access memory (MRAM) offers comparable performance to volatile static random access memory (SRAM) and comparable density with lower power consumption to volatile dynamic random access memory (DRAM). Compared to non-volatile memory (NVM) flash memory, an MRAM offers much faster access times and suffers minimal degradation over time, whereas a flash memory can only be rewritten a limited number of times. An MRAM cell is formed by a magnetic tunneling junction (MTJ) comprising two ferromagnetic layers that are separated by a thin insulating barrier, and operates by tunneling of electrons between the two ferromagnetic layers through the insulating barrier.

BRIEF DESCRIPTION OF THE DRAWINGS

FIG. 13A illustrates the effect of applying alternating current to both a word line and a source line of an MRAM cell according to an embodiment of the present disclosure.

DETAILED DESCRIPTION

Figure 1B:
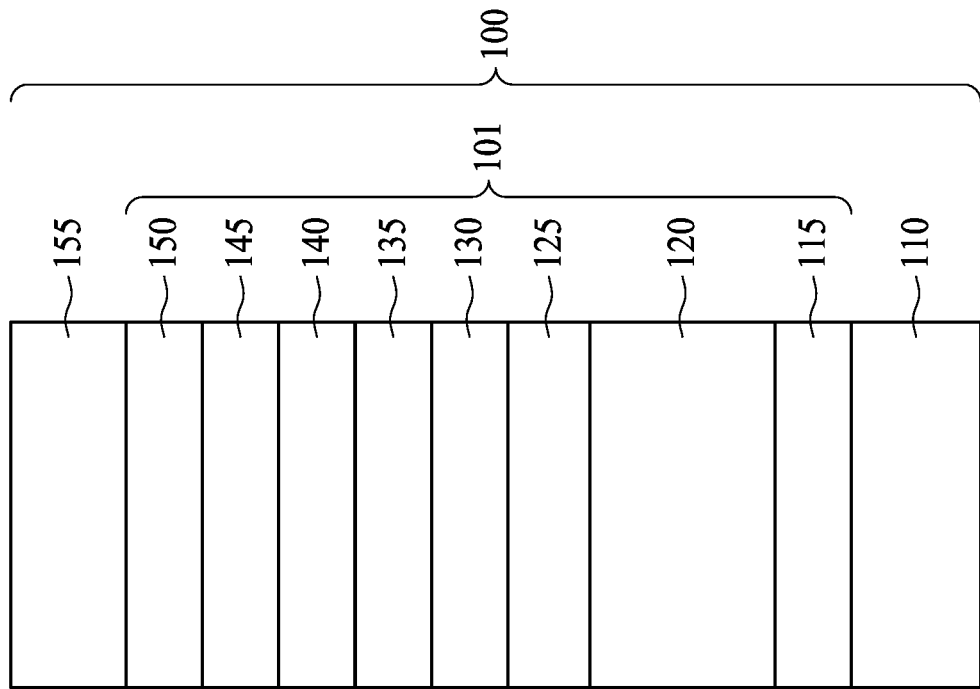
FIG. 1B is a schematic cross sectional view of the MTJ film stack according to an embodiment of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In the accompanying drawings, some layers/features may be omitted for simplification.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of." Further, in the following fabrication process, there may be one or more additional operations in/between the described operations, and the order of operations may be changed. In the present disclosure, a phrase "one of A, B and C" means "A, B and/or C" (A, B, C, A and B, A and C, B and C, or A, B and C), and does not mean one element from A, one element from B and one element from C, unless otherwise described.

The MRAM cells include a film stack of multiple layers including magnetic layers. In some MRAM devices, depending on the magnetic design, one or more non-magnetic spacer layers may need to be inserted between magnetic layers to optimize the magnetic interaction. In some embodiments, one or more diffusion barrier layers may be inserted into the film stack to minimize adverse diffusion phenomenon. Further, in the MTJ MRAM cells, other than the tunneling barrier layer, every layer within the film stack needs to be conductive to maximize a read/write window.

Material for a seed layer, a spacer layer and/or a diffusion barrier layer is appropriately selected in some embodiments to provide a desired specific crystalline structure and orientation, and does not disrupt the magnetic interactions of the functional layers. Further, the seed layer, the spacer layer and the diffusion barrier layer should be smooth, non-orientation specific (amorphous), conductive and non-magnetic.

The magnetic tunneling function of the MTJ MRAM cells depends on a specific crystalline structure and an orientation of the MTJ films. In order to have the desired crystalline structure and orientation in the MTJ films, the whole film stack needs to be grown on a smooth, amorphous, conductive, non-magnetic seed layer. Among various materials, tantalum (Ta) is the most widely used as the seed layer, which can be easily grown as a smooth and amorphous layer. Further, a non-magnetic spacer layer, such as molybdenum (Mo), is often used in the MTJ films. Other than tantalum (Ta) and molybdenum (Mo), cobalt (Co), platinum (Pt), iridium (Ir), and/or nickel (Ni) may be used as a seed layer or a spacer layer.

The crystalline magnetic layers are grown from the crystalline lattice of the MgO layer, or the crystalline magnetic layers use the crystalline lattice as a growth template.

Figure 1A:
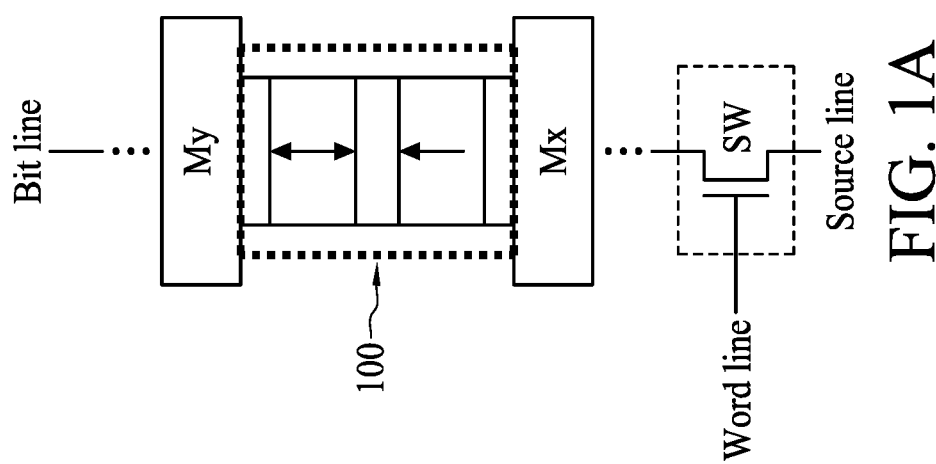
FIG. 1A is a schematic view of a MTJ MRAM cell according to an embodiment of the present disclosure.

FIG. 1A is a schematic view of a MTJ MRAM cell according to an embodiment of the present disclosure. The MTJ film stack 100 is disposed between a lower metal layer Mx and an upper metal layer My of a semiconductor device. The metal layers Mx and My are used to connect one element to another element in a semiconductor device formed at a different level above a substrate. Further, the lower metal layer Mx is coupled to a switching device SW, which can be formed by a MOS FET including, but not limited to, a planar MOS FET, a fin FET, a gate-all-around (GAA) FET, or any other switching devices. A control terminal (e.g., a gate terminal of FET) of the switching device is coupled to a word line. One of the terminals of the switching device SW is coupled to the lower metal layer Mx and the other terminal is coupled to the source line, which is a fixed potential (e.g., the ground) in some embodiments. The upper metal layer My is coupled to a bit line. In some embodiments, the switching device SW is disposed between the upper metal layer My and the bit line.

The MTJ film stack 100 includes a first electrode layer 110 coupled to the lower metal layer Mx and a second electrode layer 155 coupled to the upper metal layer My. An MTJ functional layer 101 is disposed between the first electrode layer 110 and the second electrode layer 155, as shown in FIG. 1B.

The MTJ functional layer 101 includes a second pinned magnetic layer 130, a free magnetic layer 140, and a tunneling barrier layer 135 made of a non-magnetic material and disposed between the second pinned magnetic layer 130 and the free magnetic layer 140. The free magnetic layer 140 and the second pinned magnetic layer 130 include one or more ferromagnetic materials that can be magnetically oriented, respectively. The free magnetic layer 140 is configured such that the magnetic orientation can be changed, or rotated, by exposure to an external magnetic field. The second pinned magnetic layer 130 is configured such that the magnetic orientation is fixed and will not respond to a typical magnetic field. In some embodiments, the thickness of the free magnetic layer 140 is in a range from about 0.8 nm to about 1.5 nm. In some embodiments, the thickness of the second pinned layer 130 is in a range from about 0.8 nm to about 2.0 nm.

The tunneling barrier layer 135 includes a relatively thin oxide layer capable of electrically isolating the free magnetic layer 140 from the second pinned magnetic layer 130 at low potentials and capable of conducting current through electron tunneling at higher potentials. In some embodiments, the tunneling barrier layer 135 is made of magnesium oxide (MgO) having a thickness in a range from about 0.5 nm to about 1.2 nm.

In some embodiments, the MTJ functional layer 101 further includes an antiferromagnetic layer 125, as shown in FIG. 1B. The anti-ferromagnetic layer 125 is used to fix the magnetic orientation of the second pinned magnetic layer 130. The antiferromagnetic layer 125 includes ruthenium (Ru) or any other suitable antiferromagnetic material. In some embodiments, the thickness of the antiferromagnetic layer 125 is in a range from about 0.4 nm to about 1.0 nm.

The MTJ functional layer 101 further includes a first pinned magnetic layer 120 including one or more magnetic materials, as shown in FIG. 1B.

Figure 2A:
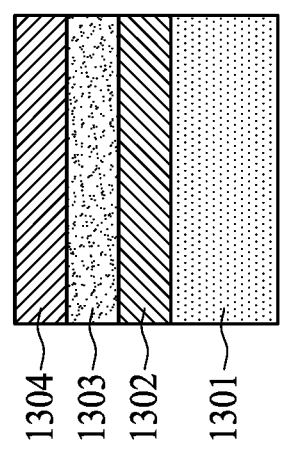
FIGS. 2A, 2B, and 2C show schematic cross sectional views of magnetic layers of the MTJ film stack according to an embodiment of the present disclosure.

The second pinned magnetic layer 130 includes multiple layers of magnetic materials. In some embodiments, as shown in FIG. 2A, the second pinned magnetic layer 130 includes four layers 1301, 1302, 1303 and 1304, where layer 1304 is in contact with the tunneling barrier layer 135 and layer 1301 is in contact with the antiferromagnetic layer 125. In some embodiments, layer 1301 (the bottommost layer) includes a layer of Co. In some embodiments, a thickness of the cobalt layer is in a range from about 0.4 nm to about 0.6 nm. In some embodiments, layer 1302 includes a multilayer structure of cobalt (Co) and platinum (Pt). The thickness of the cobalt layer is in a range of about 0.3 nm to about 0.6 nm and a thickness of the platinum layer is in a range from about 0.2 nm to about 0.5 nm. The thickness of the cobalt layer can be the same as or greater than the platinum layer. The cobalt layers and the platinum layers are alternately stacked such that the total thickness of layer 1302 is in a range from about 2.0 nm to about 5.0 nm in some embodiments. In certain embodiments, layer 1301 is the cobalt layer and layer 1302 is the multilayer of the cobalt layers and the platinum layers as set forth above. In this disclosure, an "element" layer generally means that the content of the "element" is more than 99 atomic %.

Layer 1303 is a spacer layer. In some embodiments, the spacer layer includes Ta, Mo, Co, Pt, Ir, and/or Ni. The thickness of the spacer layer 1303 is in a range from about 0.2 nm to about 0.5 nm in some embodiments. The layer 1304 is a cobalt iron boron (CoFeB) layer, a cobalt/palladium (CoPd) layer and/or a cobalt iron (CoFe) layer. The thickness of the layer 1304 is in a range from about 0.8 nm to about 1.5 nm in some embodiments.

Figure 2B:
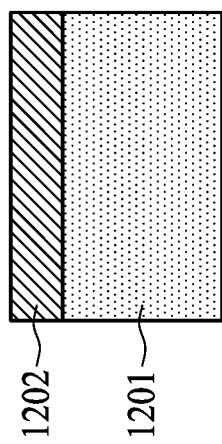

The first pinned magnetic layer 120 includes multiple layers of magnetic materials. In some embodiments, as shown in FIG. 2B, the first pinned magnetic layer 120 includes two layers 1201 and 1202, where layer 1202 is in contact with the antiferromagnetic layer 125. In some embodiments, layer 1201 includes a multilayer structure of cobalt (Co) and platinum (Pt). In some embodiments, a thickness of the cobalt layer is in a range from about 0.3 nm to about 0.6 nm and a thickness of the platinum layer is in a range from about 0.2 nm to about 0.5 nm. The thickness of the cobalt layer can be the same as or greater than the platinum layer. The cobalt layers and the platinum layers are alternately stacked such that the total thickness of the layer 1201 is in a range from about 5.0 nm to about 10.0 nm in some embodiments. The layer 1202 includes a cobalt layer having a thickness in a range from about 0.4 nm to about 0.6 nm in some embodiments.

Figure 2C:
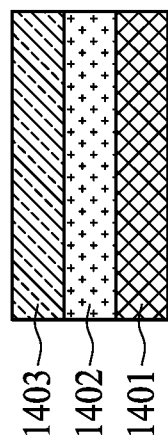

The free magnetic layer 140 includes a cobalt iron boron (CoFeB) layer, a cobalt/palladium (CoPd) layer and/or a cobalt iron (CoFe) layer having a thickness in a range from about 1.0 nm to about 2.0 nm in some embodiments. In other embodiments, the free magnetic layer 140 includes multiple layers of magnetic materials. In some embodiments, as shown in FIG. 2C, the free magnetic layer 140 includes three layers 1401, 1402 and 1403, where the layer 1401 is in contact with the tunneling barrier layer 135. Layers 1401 and 1403 are a cobalt iron boron (CoFeB) layer, a cobalt/palladium (CoPd) layer and/or a cobalt iron (CoFe) layer having a thickness in a range from about 1.0 nm to about 2.0 nm in some embodiments. The layer 1402 is a spacer layer. In some embodiments, the spacer layer includes Ta, Mo, Co, Pt, Ir, and/or Ni. The thickness of the spacer layer 1402 is in a range from about 0.2 nm to about 0.6 nm in some embodiments.

In some embodiments, the MTJ functional layer 101 further includes a seed layer 115 formed on the first electrode layer 110, a capping layer 145 formed on the free magnetic layer 140, and a diffusion barrier layer 150 formed on the capping layer 145, as shown in FIG. 1B. The capping layer 145 is made of a dielectric material, such as magnesium oxide or aluminum oxide, and has a thickness in a range from about 0.5 nm to about 1.5 nm in some embodiments. The first electrode layer 110 is made of a conductive material, such as a metal, to reduce the resistance of the first pinned magnetic layer 120, especially for programming. The second electrode layer 155 is also made of a conductive material, such as a metal, to reduce the resistivity during reading.

In some embodiments, the seed layer 115 includes a Pt layer and or Pt layer and a Ta layer. The seed layer 115 is for a growth of the first pinned magnetic layer 120, and generally has a smooth surface morphology, a high electric conductivity, and is substantially free of diffusion into the pinned magnetic layer 120. The thickness of the seed layer 115 is in a range from about 0.5 nm to about 20 nm in some embodiments, and is in a range from about 1.0 nm to about 10 nm in other embodiments. The seed layer 115 is amorphous in some embodiments.

In some embodiments, the diffusion barrier layer 150 includes a tantalum layer and/or a binary alloy layer of iridium and tantalum. The diffusion barrier layer for the MTJ film stack generally has a super smooth surface morphology, a high electric conductivity, and is substantially effective in alleviating diffusion issues. Further, the diffusion barrier layer should also be tolerant to a low level of oxidation without significant conductivity degradation. The thickness of the diffusion barrier layer 150 is in a range from about 0.1 nm to about 10 nm in some embodiments, and is in a range from about 0.5 nm to about 5.0 nm in other embodiments.

In some embodiments, the spacer layer 1303 and/or the spacer layer 1402 include an iridium layer and/or a binary alloy layer of iridium and tantalum. A spacer layer for the MTJ film stack is generally required to have a super smooth surface morphology and a high electric conductivity and to be substantially free from a diffusion issue. Further, the spacer layer should also be tolerant to a low level of oxidation without significant degradation of its conductivity. The thickness of the spacer layers 1303 and/or 1402 is in a range from about 0.1 nm to about 10 nm in some embodiments, and is in a range from about 0.5 nm to about 5.0 nm in other embodiments.

In some embodiments, the first electrode layer 110 is formed on the lower metal layer Mx made of, for example, Cu, Al, W, Co, Ni, and/or an alloy thereof; and the upper metal layer My made of, for example, Cu, Al, W, Co, Ni, and/or an alloy thereof, and is formed on the second electrode layer 155.

The pinned magnetic layer, the free magnetic layer, the antiferromagnetic layer, and the spacer/barrier layer can be formed by CVD, PVD or ALD or any other suitable film deposition method. The tunneling barrier layer can also be formed by CVD, PVD or ALD or any other suitable film deposition method. The first and second electrode layers can also be formed by CVD, PVD, ALD, or electro plating, or any other suitable film deposition method.

In some embodiments, the first electrode layer 110 is formed on the lower metal layer Mx, which has been patterned, the seed layer 115 is formed on the first electrode layer 110, the first pinned magnetic layer 120 is formed on the seed layer 115, the antiferromagnetic layer 125 is formed on the first pinned magnetic layer 120, the second pinned magnetic layer 130 is formed on the antiferromagnetic layer 125, the tunneling barrier layer 135 is formed on the second pinned magnetic layer 130, the free magnetic layer 140 is formed on the tunneling barrier layer 135, the capping layer 145 is formed on the free magnetic layer 140, the diffusion barrier layer 150 is formed on the capping layer 145, and the second electrode layer 155 is formed on the diffusion barrier layer 150. One or more lithography and etching operations are performed to pattern the stacked layer into the MTJ film stack for each memory cell. In other embodiments, trenches for memory cells are formed in a dielectric layer and the MTJ film is formed in the trenches.

In some embodiments, the circuit includes a word line decoder 350, 440, 550, a word line driver 360, 450, 560, and a bit line decoder 310, 410 and a bit line driver 320, 420 or a source line decoder 510 and a source line driver 520.

In some embodiments, the MRAM cells are formed over a dielectric material disposed over the substrate. In some embodiments, the substrate includes silicon (Si) and/or silicon oxide or other suitable semiconductor material. Transistors, driver circuits, logic circuits or any other electronic devices are formed by semiconductor materials and integrated with the MRAM cells.

FIGS. 3A-3D show a memory operation of MTJ cell. As shown in FIGS. 3A-3D, the MTJ cell includes a pinned magnetic layer 10, a tunneling barrier layer 15 and a free magnetic layer 20. The pinned magnetic layer 10 corresponds to the second pinned magnetic layer 130 or the combination of the first pinned magnetic layer 120, the antiferromagnetic layer 125 and the second pinned magnetic layer 130 of FIG. 1B. The tunneling barrier layer 15 corresponds to the tunneling barrier layer 135 of FIG. 1B and the free magnetic layer 20 corresponds to the free magnetic layer 140 of FIG. 1B. In FIGS. 3A-3D, the remaining layers are omitted. A current source 30 is coupled to the MTJ structure in series.

Figure 3D:
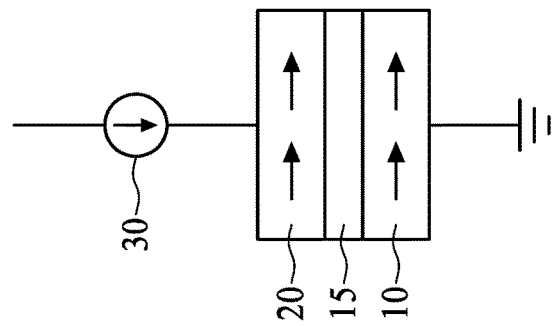
FIGS. 3C and 3D show a memory operation of an MTJ cell according to another embodiment of the disclosure.
Figure 3C:
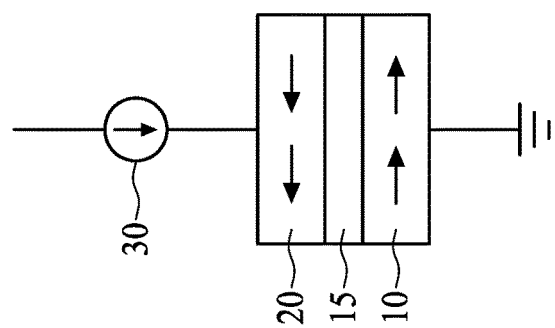
Figure 3B:
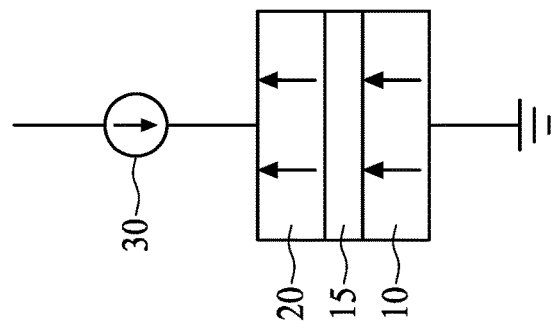
FIGS. 3A and 3B show a memory operation of an MTJ cell according to an embodiment of the disclosure.
Figure 3A:
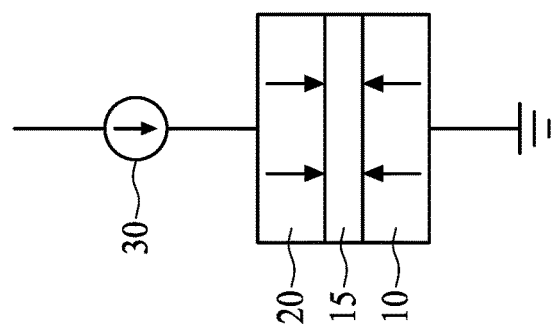

In FIG. 3A, the pinned magnetic layer 10 and the free magnetic layer 20 are magnetically oriented in opposite directions. In some embodiments, the spin directions of the pinned magnetic layer 10 and the free magnetic layer 20 are parallel to the film stack direction (perpendicular to the surface of the films). In FIG. 3B, the pinned magnetic layer 10 and the free magnetic layer 20 are magnetically oriented in the same direction. In other embodiments, the spin directions of the pinned magnetic layer 10 and the free magnetic layer 20 are perpendicular to the film stack direction (parallel with the surface of the films), as shown in FIGS. 3C and 3D. In FIG. 3C, the pinned magnetic layer 10 and the free magnetic layer 20 are magnetically oriented in opposite directions, while in FIG. 3D, the pinned magnetic layer 10 and the free magnetic layer 20 are magnetically oriented in the same direction.

If the same current value $I_C$ is forced to flow through the MTJ cell by the current source 30, it is found that the cell voltage $V_1$ in the case of FIG. 3A (or FIG. 3C) is larger than the cell voltage $V_2$ in the case of FIG. 3B (or FIG. 3D), because the resistance of an opposite-oriented MTJ cell shown in FIG. 3A (or FIG. 3C) is greater than the resistance of a same-oriented MTJ cell shown in FIG. 3B (or FIG. 3D). Binary logic data ("0" and "1") can be stored in a MTJ cell and retrieved based on the cell orientation and resulting resistance. Further, since the stored data does not require a storage energy source, the cell is non-volatile.

Figure 4:
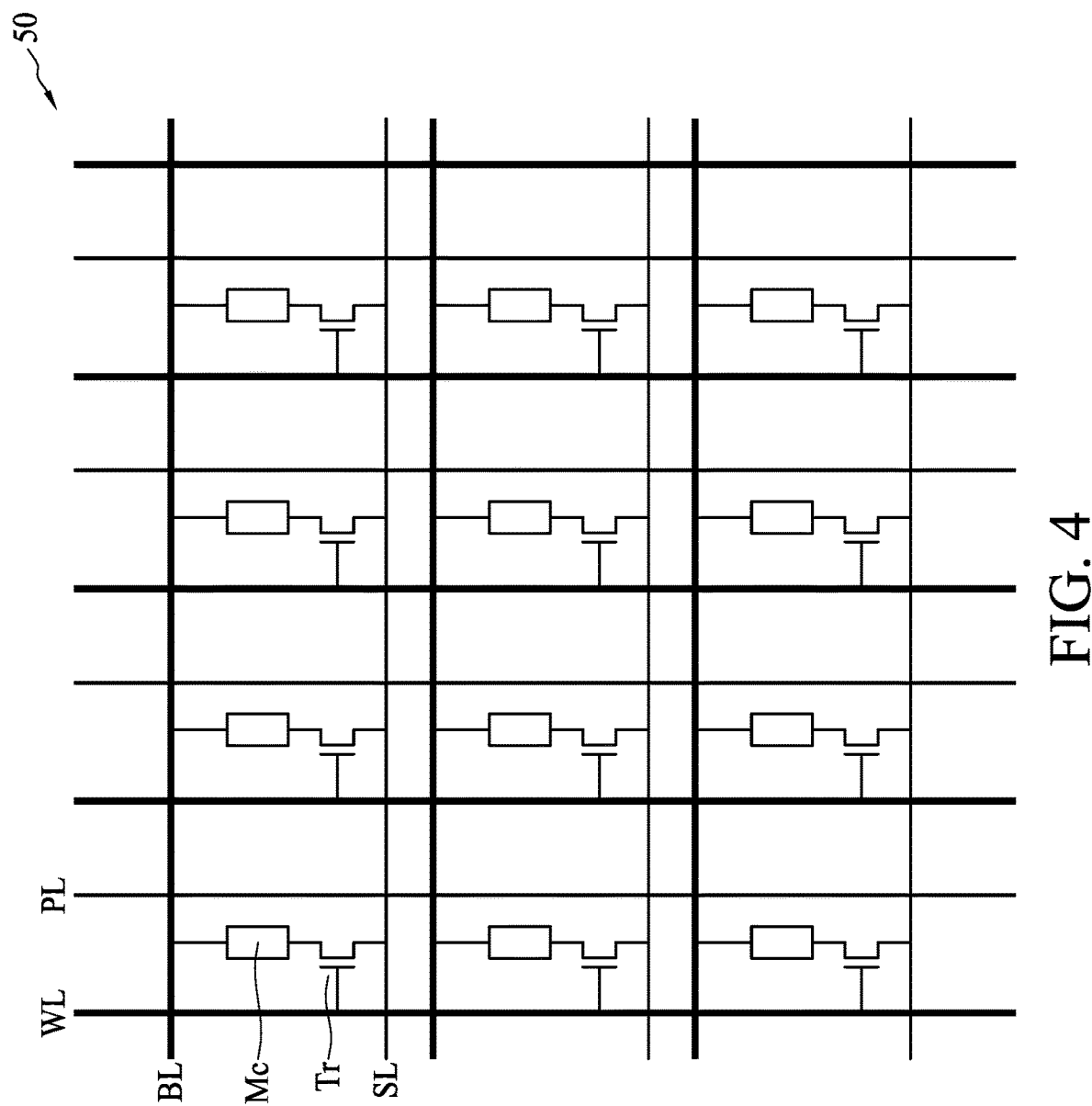
FIG. 4 shows an MRAM array.

FIG. 4 shows an MRAM array 50. Each memory cell includes a MTJ cell Mc and a transistor Tr, such as a MOS FET. The gate of the transistor Tr is coupled to a word line WL and a drain (or a source) of the transistor Tr is coupled to one end of the MTJ cell Mc, and another end of the MTJ cell is coupled to a bit line BL. Further, a signal line PL for programming is provided adjacent to the MTJ cells.

A memory cell is read by asserting the word line of that cell, forcing a reading current through the bit line BL of that cell, and then measuring the voltage on that bit line BL. For example, to read the state of a target MTJ cell, the word line WL is asserted to turn ON the transistor Tr. The free magnetic layer of the target MTJ cell is thereby coupled to the fixed potential SL, e.g., the ground through the transistor Tr. Next, the reading current is forced on the bit line BL. Since only the given reading transistor Tr is turned ON, the reading current flows through the target MTJ cell to the ground. The voltage of the bit line BL then measured to determine the state ("0" or "1") of the target MTJ cell. In some embodiments, as shown in FIG. 4, each MTJ cell has one reading transistor Tr. Therefore, this type of MRAM architecture is called 1T1R. In other embodiments, two transistors are assigned to one MTJ cell, forming a 2T1R system. Other cell array configurations can be employed.

Figure 5:
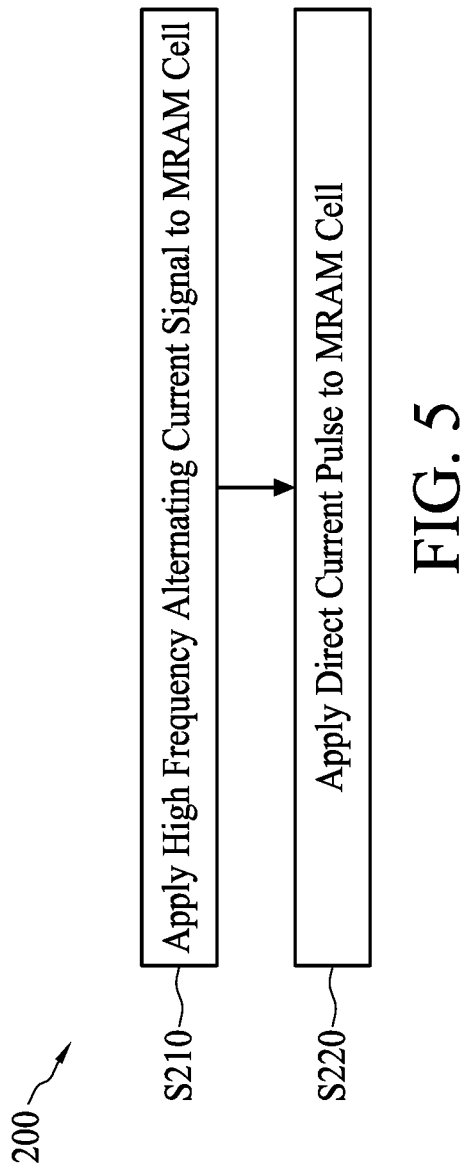
FIG. 5 is a flowchart showing a method of writing to an MRAM cell according to an embodiment of the disclosure.

Changing the magnetic orientation of an MRAM cell is a two-step process: (1) spin current excites the free layer spin into precession (i.e. ferromagnetic resonance) and (2) spin torque current flips the free layer spin. Conventionally, a long direct current write pulse is required to flip (change) the magnetic orientation. The first step of precession is particularly slow when a direct current write pulse is used. The flipping operation can be accelerated if the precession is excited. As shown in FIG. 5, a method 200 of writing to an MRAM cell according to an embodiment of the disclosure includes an operation S210 of applying a high frequency alternating current signal set to a frequency near the ferromagnetic resonance frequency of the free layer to the MRAM cell to speed up the precession step. Then a direct current pulse is applied in operation S220 to flip (change the magnetic orientation) of the MRAM cell. In other embodiments, microwave energy at the resonant frequency is used to accelerate precession. Although application of a high frequency alternating current signal or microwave energy can excite the free layer spin into ferromagnetic resonance, an additional step of applying a direct current write pulse is used to change the magnetic orientation of the MRAM cell, according to embodiments of the present disclosure.

Figure 6:
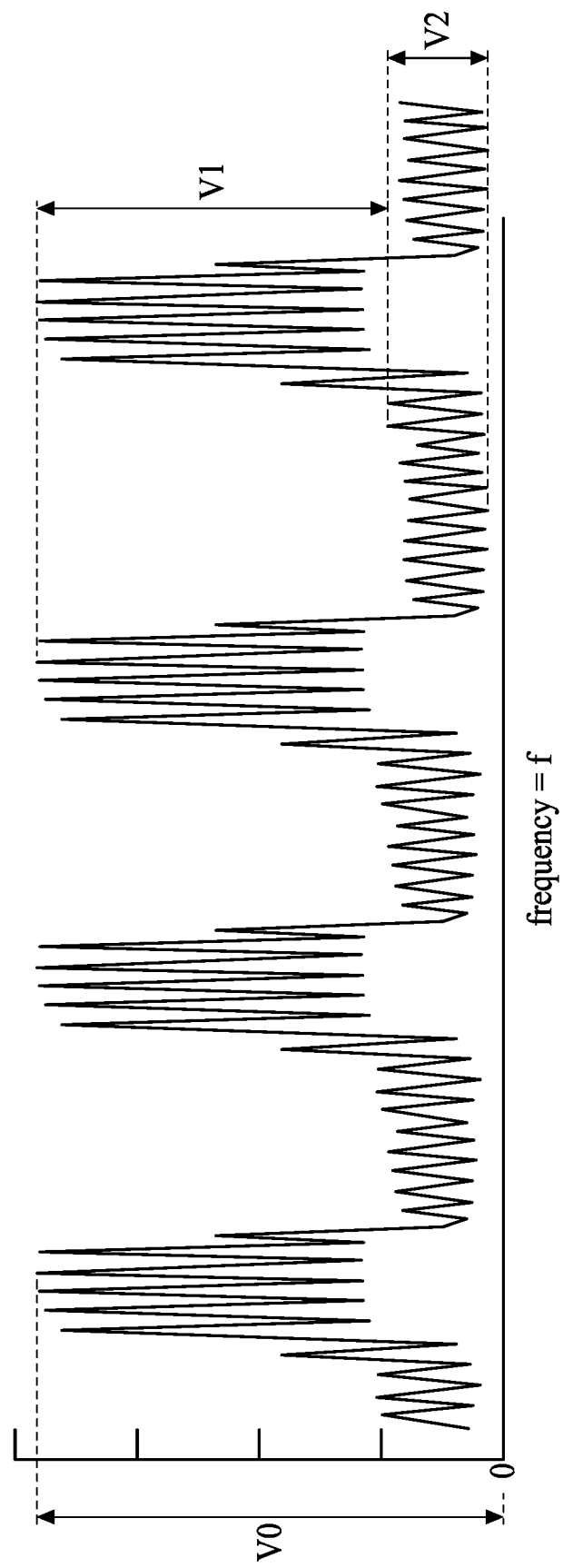
FIG. 6 illustrates the superimposing of an alternating current over a direct current pulse according to embodiments of the present disclosure.

In some embodiments of the present disclosure, the two-step process to change the magnetic orientation is performed by superimposing a high frequency alternating current signal over the direct current write pulse, as illustrated in FIG. 6. The high frequency alternating current signal has a lower voltage peak amplitude $V_2$ than the direct current write pulse peak amplitude $V_1$. The total voltage applied during the write operation is V1+V2=V0. The high frequency alternating current signal initiates precession, thereby allowing a lower voltage direct current to write to the MRAM cell (change the magnetic orientation). Further, superimposing the high frequency alternating current signal dramatically reduces the time required to flip (change) the magnetic orientation of the free layer of the MRAM cell. The superimposed high frequency alternating current signal allows a lower voltage direct current than would otherwise be required to flip the magnetic orientation of the free layer of the MRAM cell.

In some embodiments of the present disclosure, a method of writing to a magnetic random access memory cell includes applying an alternating current to a magnetic random access memory cell having a first magnetic orientation, and applying a direct current pulse to the magnetic random access memory cell to change the magnetic orientation of the magnetic random access memory cell from the first magnetic orientation to a second magnetic orientation. The first magnetic orientation and the second magnetic orientation are different. In some embodiments, the applying the alternating current excites a spin of a free layer of the magnetic random access memory cell into ferromagnetic resonance, and the applying the direct current pulse causes the magnetic orientation of the free layer to change. In some embodiments, the alternating current signal is superimposed over the direct current pulse.

In some embodiments, the frequency of the alternating current signal ranges from about 1 GHz to about 100 GHz. In some embodiments, the frequency of the alternating current signal ranges from about 4 GHz to about 25 GHz. In some embodiments, the frequency of the alternating current signal ranges from about 6 GHz to about 12 GHz.

In some embodiments, a voltage peak amplitude of the alternating current signal ranges from about 0.1 V to about 1 V. In some embodiments, the voltage peak amplitude of the alternating current signal ranges from about 0.2 V to about 0.5 V. In some embodiments, the voltage peak amplitude of the direct current pulse ranges from about 0.3 V to about 3 V. In some embodiments, the voltage peak amplitude of the direct current pulse ranges from about 0.5 V to about 2 V. In some embodiments, the voltage peak amplitude of the direct current pulse ranges from 0.7 V to about 1.2 V. In some embodiments, the direct current pulse is a rectangular pulse having a pulse length of about 5 nsec to about 250 nsec. In some embodiments, the direct current pulse has a length of about 10 nsec to about 100 nsec.

In some embodiments, the applying an alternating current signal includes sweeping through a range of frequencies or voltages. In some embodiments, while the alternating current signal is applied, the frequency of the alternating current signal is increased from about 1 GHz to about 100 GHz. In other embodiments, the frequency of the alternating current signal is increased from about 4 GHz to about 25 GHz while the alternating current signal is being applied, and in some other embodiments, the frequency of the applied alternating current signal is increased from about 6 GHz to about 12 GHz.

Figure 7B:
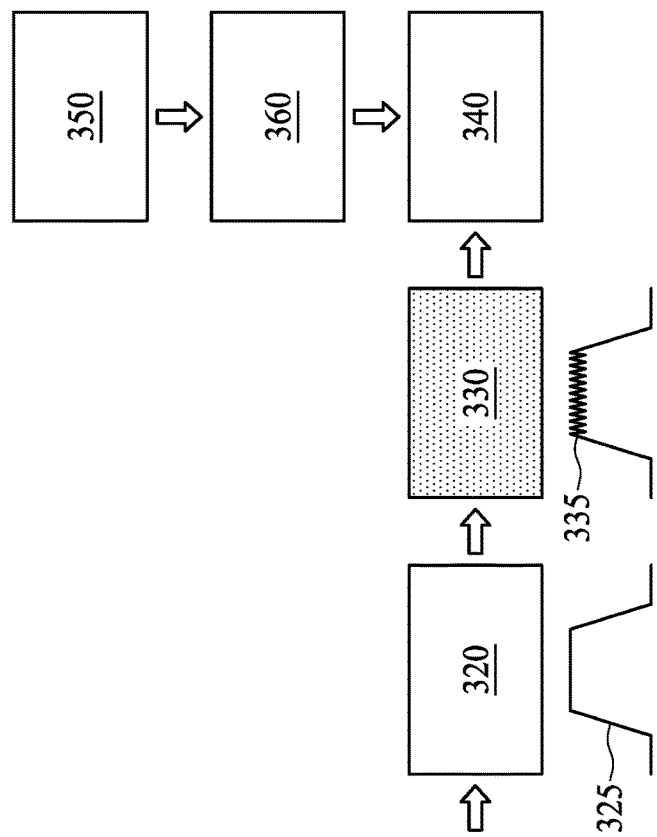
FIG. 7B illustrates a circuit for applying alternating and direct current through the bit line of an MRAM array according to an embodiment of the disclosure.
Figure 7A:
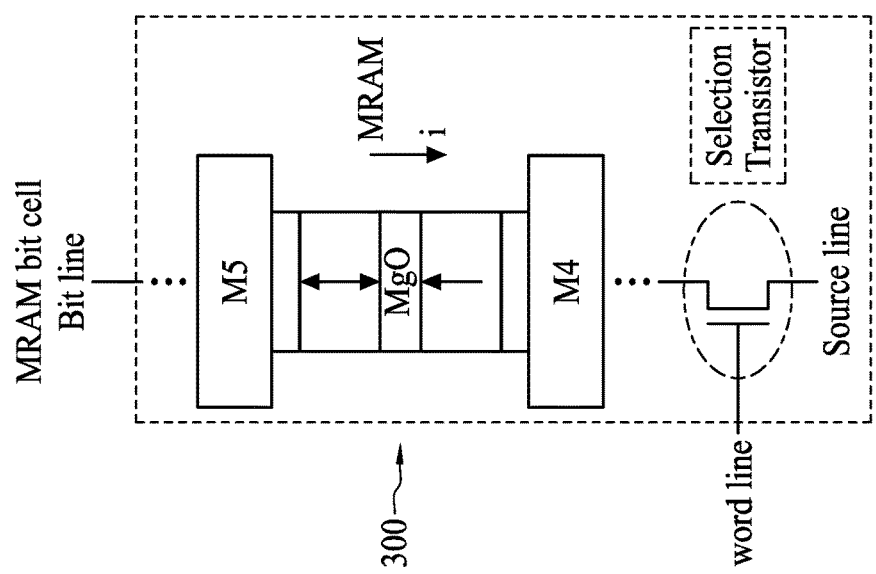
FIG. 7A shows an MRAM cell according to an embodiment.

In some embodiments, while the alternating current signal is applied, the voltage amplitude of the alternating current signal is increased from about 0.1 V to about 1 V. The voltage amplitude of the applied alternating current signal is increased from about 0.2 V to about 0.5 V in other embodiments. In some embodiments, the alternating current is applied to a bit line, a word line, or a source line of a magnetic random access memory device. For example, FIG. 7A shows an MRAM cell 300 according to an embodiment, and FIG. 7B illustrates a circuit for applying an alternating current signal through the bit line of an MRAM array 340 according to an embodiment of the disclosure. To write to the MRAM cell 300 in the MRAM array 340 in an embodiment of the disclosure, a signal from a bit line decoder 310 is carried through the bit line, a direct current pulse 325 is provided via the bit line by a bit line driver 320, and a high frequency alternating current signal 335 is superimposed over the direct current pulse 325 via the bit line by a high frequency alternating current source 330. Meanwhile, a signal from a word line decoder 350 and word line driver 360 is provided to the MRAM array 340. A particular MRAM cell 300 in the memory array 340 at which the direct current pulse 325 (superimposed with the high frequency alternating current signal 335) in the particular bit line and the signal in word line meet is the MRAM cell that will be written to (have its magnetic orientation changed).

Figure 8B:
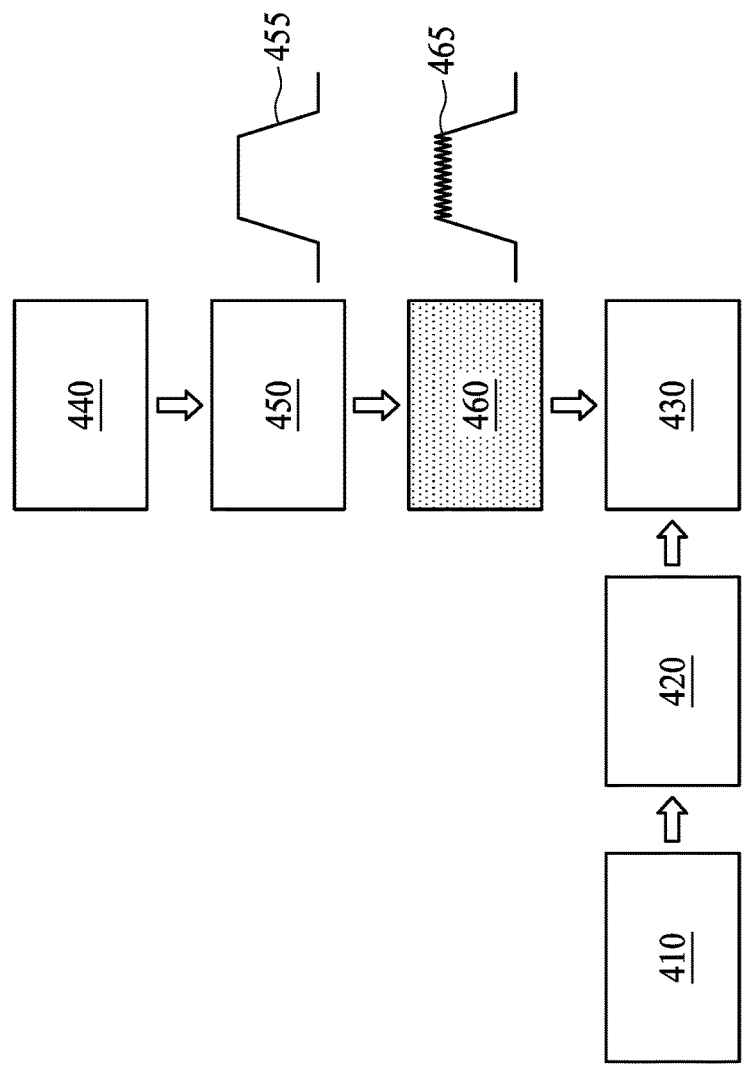
FIG. 8B illustrates a circuit for applying alternating and direct current through the word line of an MRAM array according to an embodiment of the disclosure.
Figure 8A:
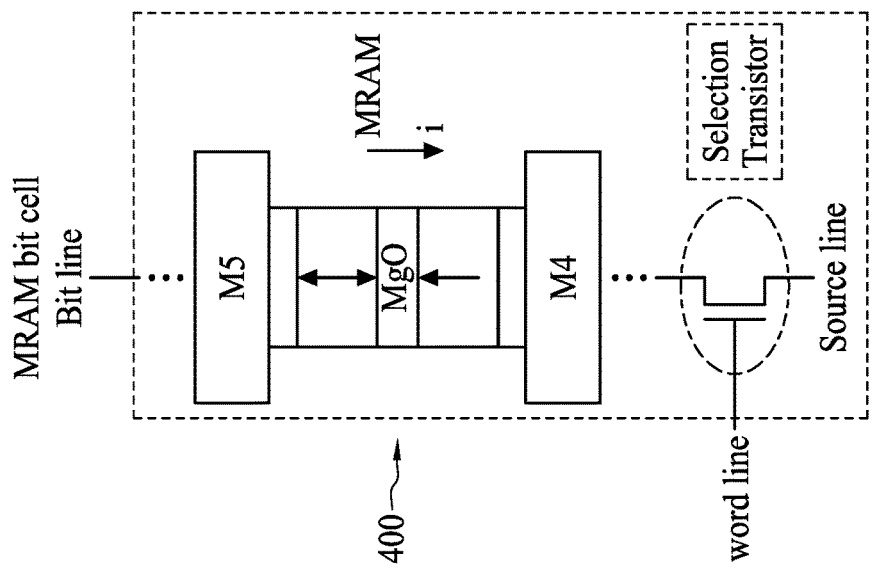
FIG. 8A shows an MRAM cell according to an embodiment.

FIG. 8A shows an MRAM cell 400 according to an embodiment, and FIG. 8B illustrates a circuit for applying an alternating current signal through the word line of an MRAM array 430 according to an embodiment of the disclosure. To write to the MRAM cell 400 in the MRAM array 430 in an embodiment of the disclosure, a signal from a bit line decoder 410 and bit line driver 420 is provided to the MRAM array 430. Meanwhile, a signal from a word line decoder 440 is carried through the word line, a direct current pulse 455 is provided via the word line by a word line driver 450, and a high frequency alternating current signal 465 is superimposed over the direct current pulse 455 via the word line by a high frequency alternating current source 460. A particular MRAM cell 400 in the memory array 430 at which the signal in the particular bit line and the direct current pulse 455 (superimposed with the high frequency alternating current signal 465) in the word line meet is the MRAM cell that will be written to (have its magnetic orientation changed).

Figure 9B:
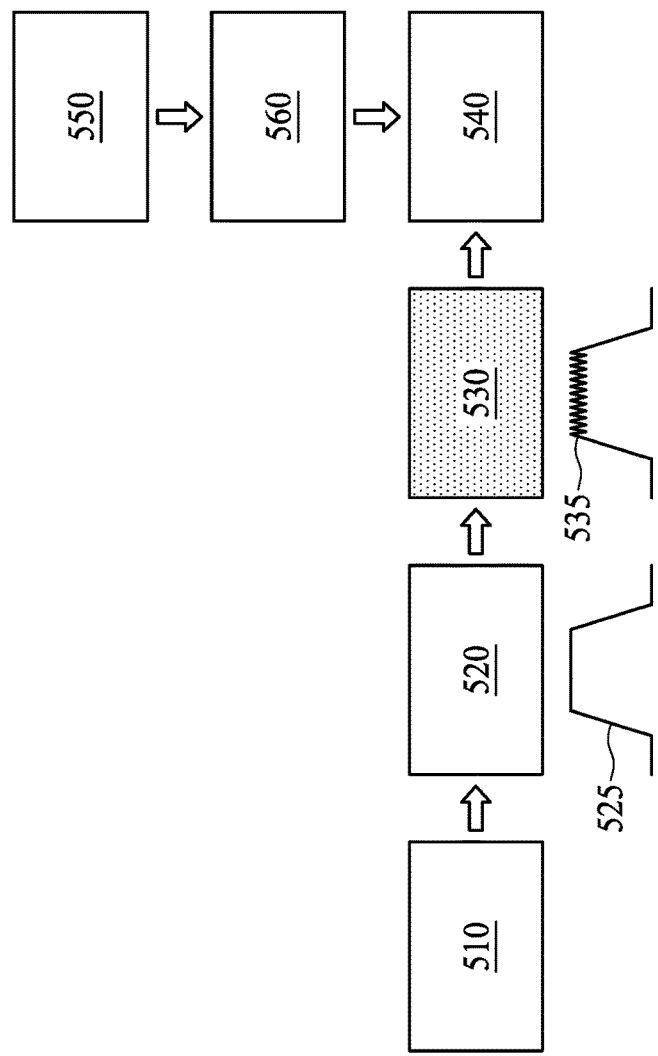
FIG. 9B illustrates a circuit for applying alternating and direct current through the source line of an MRAM array according to an embodiment of the disclosure.
Figure 9A:
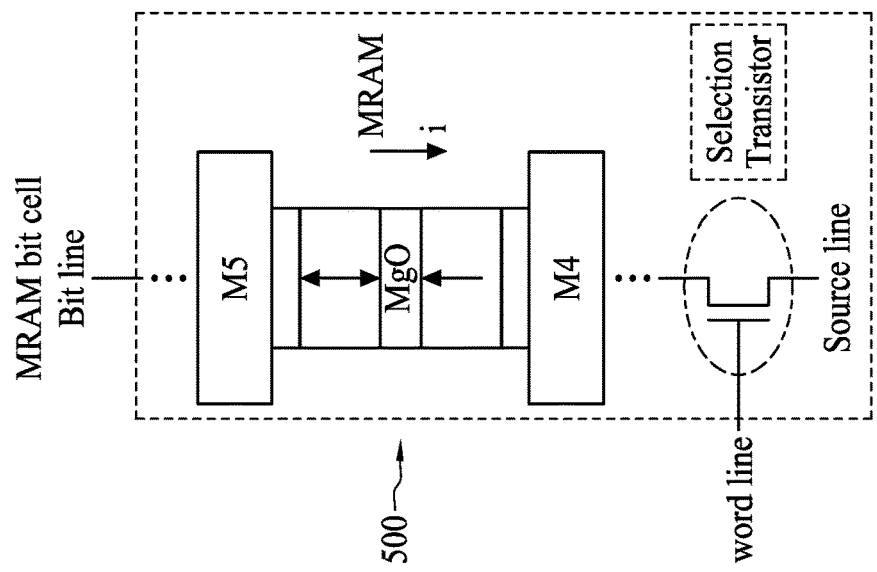
FIG. 9A shows an MRAM cell according to an embodiment.

FIG. 9A shows an MRAM cell 500 according to an embodiment, and FIG. 9B illustrates a circuit for applying alternating current through the source line of an MRAM array 540 according to an embodiment of the disclosure. To write to the MRAM cell 500 in the MRAM array 540 in an embodiment of the disclosure, a signal from a source line decoder 510 is carried through the source line, a direct current pulse 525 is provided via the source line by a source line driver 520, and a high frequency alternating current signal 535 is superimposed over the direct current pulse 525 via the source line by a high frequency alternating current source 530. Meanwhile, a signal from a word line decoder 550 and word line driver 560 is provided to the MRAM array 540. A particular MRAM cell 500 in the memory array 540 at which the direct current pulse 525 (superimposed with the high frequency alternating current signal 535) in the source line and the signal in the word line meet is the MRAM cell that will be written to (have its magnetic orientation changed).

In some embodiments, a circuit for writing to a magnetic random access memory cell, includes a driver configured to apply a direct current pulse to a random access memory cell, and an alternating current source configured to apply an alternating current signal to the random access memory cell, as shown in FIGS. 7B, 8B, and 9B. In some embodiments, the driver is a bit line driver 320, a source line driver 520, or a word line driver 450 configured to apply the direct current pulse to a bit line, a source line, or a word line of the random access memory cell, respectively. In some embodiments, the alternating current source is configured to apply a high frequency alternating current signal 335, 535, 465 to the same bit line, source line, or word line of the random access memory cell as the direct current pulse.

In some embodiments, the circuit includes a word line decoder 350, 440, 550, a word line driver 360, 450, 560, and a bit line decoder 310, 410 and a bit line driver 320, 420 or a source line decoder 510 and a source line driver 520.

In some embodiments, the driver 320, 360, 420, 450, 520, 560 is a pulse generator. In some embodiments, the pulse generator generates rectangular pulses. In some embodiments, the pulse generator is configured to provide direct current pulses having a voltage peak amplitude ranging from about 0.3 V to about 3 V. In some embodiments, the pulse generator is configured to provide direct current pulses having a pulse length of about 5 nsec to about 250 nsec.

In some embodiments, the high frequency alternating current source 330, 460, 530 is an AC signal generator configured to provide current having a frequency of about 1 GHz to about 100 GHz. In some embodiments, the alternating current source is configured to provide a voltage peak amplitude of the alternating current signal ranging from about 0.1 V to about 1 V.

In some embodiments, a circuit for writing to an array of magnetic random access memory cells is provided. The circuit includes a driver configured to apply a direct current pulse to a random access memory cell, and an alternating current source configured to apply an alternating current signal to the random access memory cell.

Figure 10A:
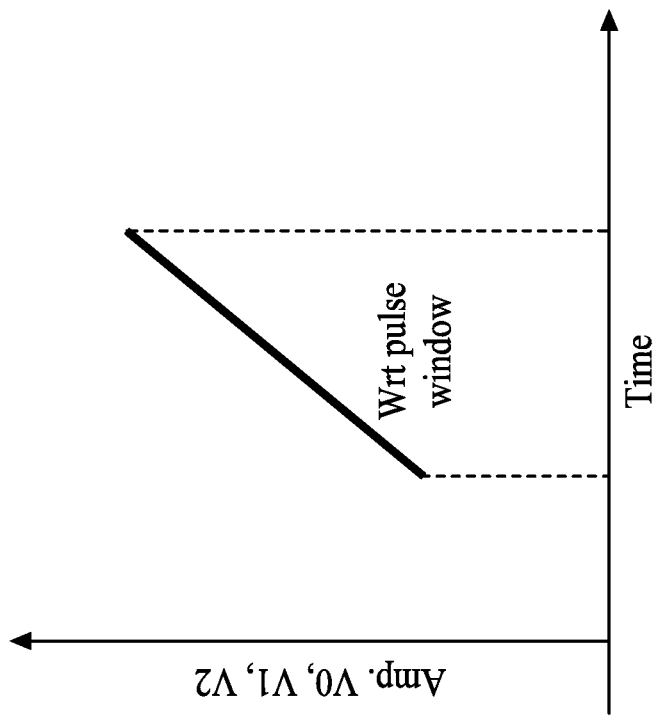
FIG. 10A illustrates sweeping the frequency of alternating current applied to an MRAM device according to an embodiment of the disclosure.
Figure 10B:
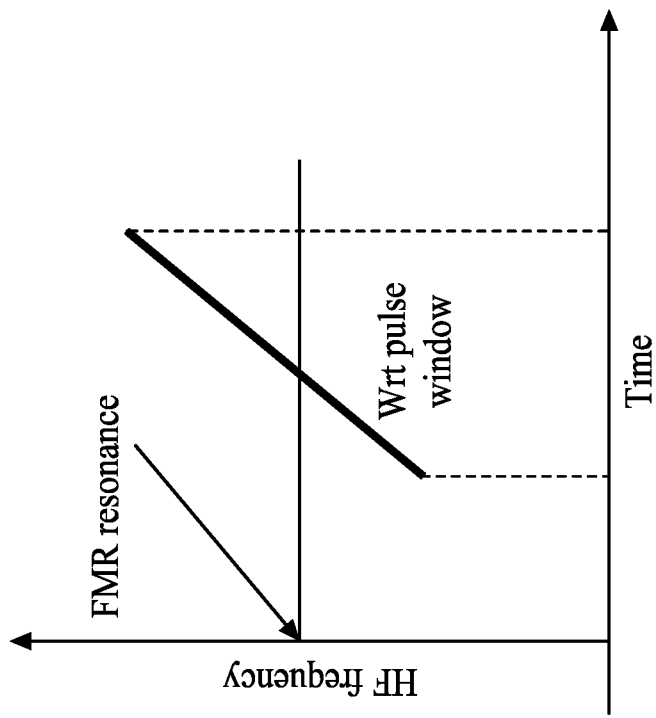
FIG. 10B illustrates sweeping the applied voltage to an MRAM device according to embodiments of the disclosure.

As shown in FIG. 10A, the frequency of alternating current signal applied to an MRAM device is swept through a range of frequencies during the direct current pulse window. The sweeping starts at a frequency less than the resonant frequency and the frequency is increased through a range including the resonant frequency during the sweep. In some embodiments, the voltage of either the high frequency alternating current signal, the direct current pulse, or both are swept from a lower voltage peak amplitude to a higher voltage peak amplitude during the pulse window, as shown in FIG. 10B.

Figure 11:
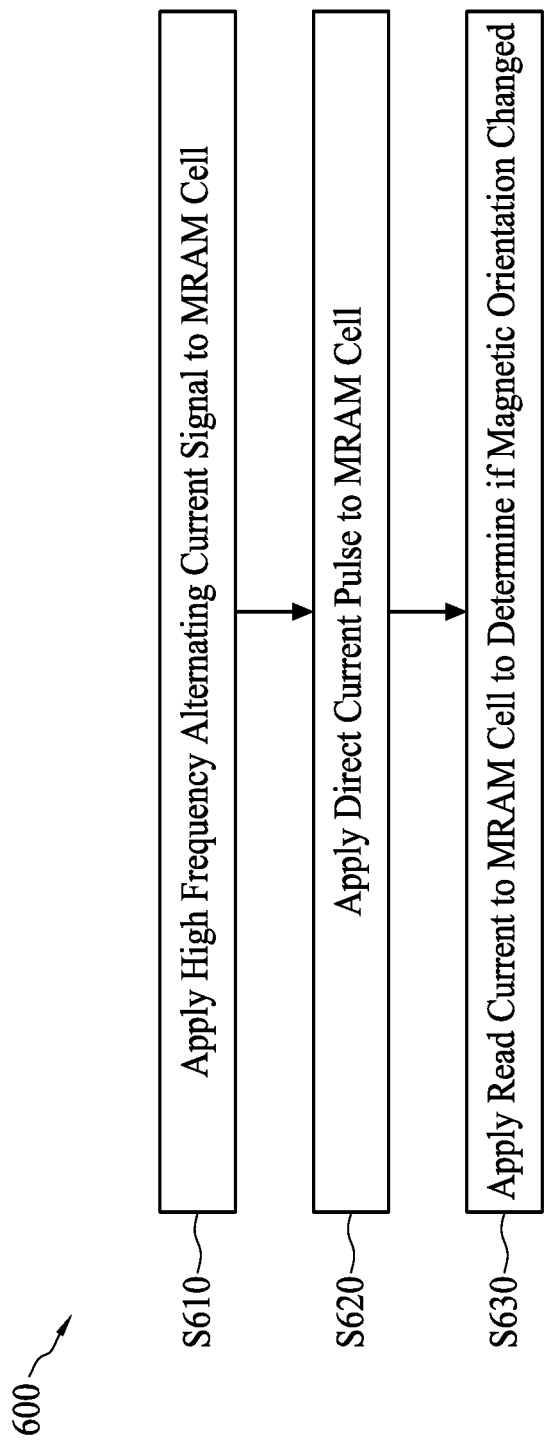
FIG. 11 is a flowchart showing a method of writing to an MRAM cell according to an embodiment of the disclosure.

An embodiment of the present disclosure is a method 600 of testing a magnetic random access memory device to determine an optimum alternating current to be applied to a magnetic random access memory device, as shown in the flowchart of FIG. 11. The method 600 includes an operation S610 of applying a high frequency alternating current signal to a magnetic random access memory cell of the magnetic random access memory device having a first magnetic orientation, and an operation S620 of applying a direct current pulse to the magnetic random access memory cell. A read current is applied to the magnetic random access memory cell in operation S630 to determine if a magnetic orientation of the magnetic random access memory cell has changed in response to applying the alternating current signal and the direct current pulse. If the magnetic orientation of the MRAM cell has not changed, the frequency of the alternating current signal is adjusted and the operations S610, S620, S630 of applying the alternating current signal, direct current pulse, and read current are repeated, and it is determined whether the magnetic orientation of the MRAM cell has changed.

The operations S610, S620, S630 of applying the alternating current signal, direct current pulse, and read current are repeated a plurality of times to a plurality of MRAM cells in the MRAM array at a variety of alternating current frequencies to determine the optimum frequency of the alternating current signal to be applied to the array of MRAM cells. The optimum frequency can be the frequency that facilitates the greatest number of MRAM cells in the array to change magnetic orientation. Alternatively, the optimum frequency can be the frequency that causes the MRAM cells to flip in the shortest amount of time or flip at the lowest direct current voltage peak amplitude.

The method 600 of testing a magnetic random access memory device is used to identify defective MRAM cells that do not change magnetic orientation under regular operating conditions in some embodiments. The defective MRAM cells can be isolated from the MRAM array by the use of fuses in the MRAM circuitry.

In some embodiments, the applying the alternating current signal excites a spin of a free layer of the magnetic random access memory cell into ferromagnetic resonance, and the applying the direct current pulse causes the magnetic orientation of the free layer to change.

In some embodiments, the alternating current signal is applied to a bit line, a word line, or a source line of a magnetic random access memory device.

In some embodiments, the alternating current signal and direct current pulse are applied to a plurality of magnetic random access memory cells, and the read current is applied to the plurality of magnetic random access memory cells to determine if a magnetic orientation of each of the plurality of magnetic random access memory cell has changed in response to applying the direct current pulse and the alternating current signal.

In some embodiments, the method includes determining an optimum alternating current signal based on whether the magnetic orientation of the magnetic random access memory cells changed and the duration of the direct current pulse required to change the magnetic orientation.

In some embodiments, the optimum alternating current signal includes an optimum range of frequencies current or an optimum frequency profile.

In some embodiments, the method is performed during a functional test of the device and the optimum current is set to be used for write operations of the device.

Likewise, in some embodiments, the voltage peak amplitude of the alternating current signal and/or the direct current pulse can be varied during functional testing of the MRAM array to determine optimum values of the voltage.

In some embodiments, the alternating current signal is superimposed over the direct current pulse. In some embodiments, the frequency of the alternating current signal ranges from about 1 GHz to about 100 GHz. In some embodiments, the frequency of the alternating current signal ranges from about 4 GHz to about 25 GHz. In some embodiments, the frequency of the alternating current signal ranges from about 6 GHz to about 12 GHz.

In some embodiments, a voltage peak amplitude of the alternating current signal ranges from about 0.1 V to about 1 V. In some embodiments, the voltage peak amplitude of the alternating current signal ranges from about 0.2 V to about 0.5 V. In some embodiments, the voltage peak amplitude of the direct current pulse ranges from about 0.3 V to about 3 V. In some embodiments, the voltage peak amplitude of the direct current pulse ranges from about 0.5 V to about 2 V. In some embodiments, the voltage peak amplitude of the direct current pulse ranges from 0.7 V to about 1.2 V. In some embodiments, the direct current pulse is a rectangular pulse having a pulse length of about 5 nsec to about 250 nsec. In some embodiments, the direct current pulse has a length of about 10 nsec to about 100 nsec.

Figure 12:
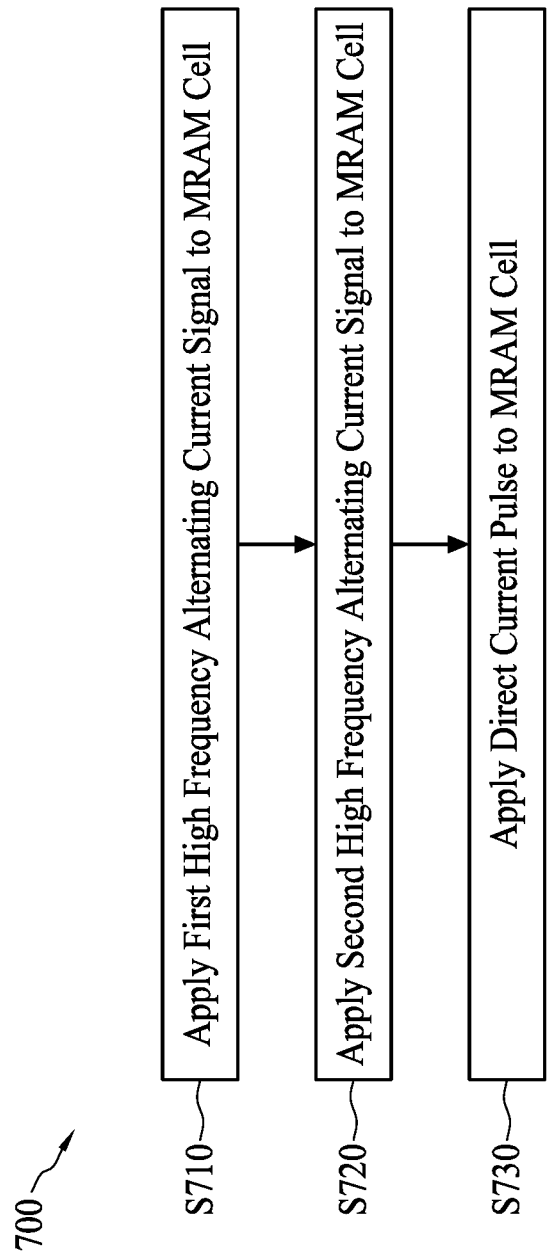
FIG. 12 is a flowchart showing a method of writing to an MRAM cell according to an embodiment of the disclosure.

FIG. 12 is a flowchart showing a method 700 of writing to an MRAM cell according to an embodiment of the disclosure. The method of writing to a magnetic random access memory cell in an array of magnetic random access memory cells, includes an operation S710 of applying a first alternating current signal to one of a word line, a source line, or a bit line of a magnetic random access memory cell in the array. The first frequency f1 of the first alternating current signal is below a frequency threshold value for causing precession of a free layer of the random access memory cell. An operation S720 of applying a second alternating current signal to another of the word line or source line of the magnetic random access memory cell is performed. The second frequency f2 of the second alternating current signal is below the frequency threshold value for causing precession of the free layer of the random access memory cell. However, when two different current signals with different frequencies are superimposed onto each other frequency mixing will occur that produces an f1+f2 component. The combined frequency of the first frequency f1 and the second frequency f2 is equal to or greater than a threshold value for causing precession of the free layer of the random access memory cell in some embodiments. In operation S730 a direct current pulse is applied to the random access memory cell while applying the first alternating current signal and the second alternating current signal to the magnetic random access memory cell thereby changing the magnetic orientation of the magnetic random access memory cell.

In some embodiments, in the array the magnetic orientation is only changed for the magnetic random access memory cell to which the first alternating current signal and the second alternating current signal are applied.

Figure 13B:
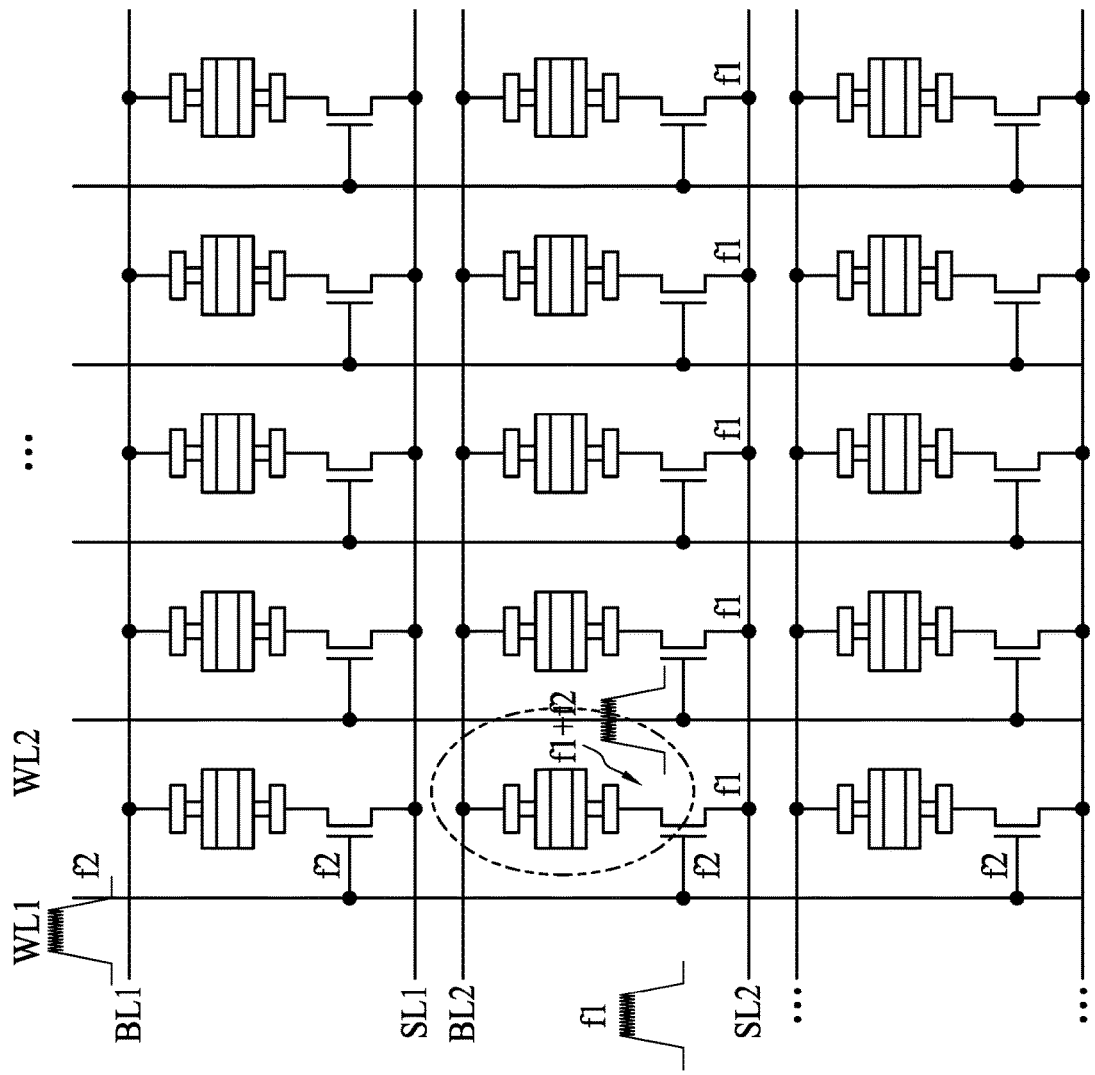
FIG. 13B illustrates changing the magnetic orientation of a single MRAM cell according to an embodiment of the present disclosure.

In some embodiments, a first high frequency f1 alternating current signal is applied to a word line 810 at the same time as a second high frequency f2 alternating current signal is applied to a source line 820 of an MRAM cell 800, as shown in FIG. 13A. The first high frequency f1 alternating current signal and the second high frequency f2 alternating current signal are both below the threshold frequency required to excite the free layer of the MRAM cell 800 into precession. However, the mixing 830 of first high frequency f1 alternating current signal and the second high frequency f2 alternating current signal results in an alternating current signal having a frequency equal to or greater than the ferromagnetic resonance (FMR) threshold frequency, and the magnetic orientation of the MRAM cell to which both the first and second high frequency alternating current signals are applied can be changed. The rest of the cells in the MRAM cells (see FIG. 13B) will not be excited into precession. Only the cell that has both high frequency alternating current signals applied will be written to because only that cell will have the combined alternating current signal that achieves the threshold frequency for ferromagnetic resonance. Thus, the write operation can be selectively performed only on the desired cells of the MRAM array.

In some embodiments, the combined frequency of the alternating current signals ranges from about 1 GHz to about 100 GHz. In some embodiments, the combined frequency of the alternating current signals ranges from about 4 GHz to about 25 GHz. In some embodiments, the combined frequency of the alternating current signals ranges from about 6 GHz to about 12 GHz.

In some embodiments, a combined voltage peak amplitude of the alternating current signals ranges from about 0.1 V to about 1 V. In some embodiments, the combined voltage peak amplitude of the alternating current signals ranges from about 0.2 V to about 0.5 V. In some embodiments, the voltage peak amplitude of the direct current pulse ranges from about 0.3 V to about 3 V. In some embodiments, the voltage peak amplitude of the direct current pulse ranges from about 0.5 V to about 2 V. In some embodiments, the voltage peak amplitude of the direct current pulse ranges from 0.7 V to about 1.2 V. In some embodiments, the direct current pulse is a rectangular pulse having a pulse length of about 5 nsec to about 250 nsec. In some embodiments, the direct current pulse has a length of about 10 nsec to about 100 nsec.

In some embodiments, a circuit for writing to an array of magnetic random access memory cells is provided. The circuit includes a driver configured to apply a direct current pulse to a random access memory cell, a first alternating current source configured to apply an alternating current signal to one of a word line or source line of a magnetic random access memory cell in the array, and a second alternating current source configured to apply a second alternating current signal to another of the word line or source line of the magnetic random access memory cell. In some embodiments, the driver is a pulse generator. In some embodiments, the pulse generator is a rectangular pulse generator. In some embodiments, the pulse generator is configured to provide direct current pulses have a voltage peak amplitude ranging from about 0.3 V to about 3 V. In some embodiments, the first alternating current source and the second alternating current source are configured to provide a combined alternating current signal having a frequency of 1 GHz to 100 GHz.

The methods of the present disclosure allow a shorter write pulse to be used to achieve a successful write operation. In some embodiments, the write pulse can be shortened by 50% or more over the application of a direct current write pulse only. The voltage peak amplitude of the write pulse can also be reduced over using a direct current pulse only because the direct current pulse only needs to flip the spin, instead of starting precession and flipping the spin. In some embodiments, the current required for the write pulse is reduced by a factor of up 10× using the methods of the present disclosure. Thus, the methods of the present disclosure allow a lower current and lower voltage pulse to be used, thereby significantly reducing the power requirements of the MRAM array.

An embodiment of the present disclosure is a method of writing to a magnetic random access memory cell including applying an alternating current signal to the magnetic random access memory cell having a first magnetic orientation, and applying a direct current pulse to the magnetic random access memory cell to change the magnetic orientation of the magnetic random access memory cell from the first magnetic orientation to a second magnetic orientation. The first magnetic orientation and the second magnetic orientation are different. In some embodiments, the alternating current signal is superimposed over the direct current pulse. In some embodiments, the frequency of the alternating current signal ranges from 1 GHz to 100 GHz. In some embodiments, a voltage peak amplitude of the alternating current signal ranges from 0.1 V to 1 V. In some embodiments, the applying an alternating current signal includes sweeping through a range of frequencies or voltages. In some embodiments, the direct current pulse is a rectangular pulse having a pulse length of 5 nsec to 250 nsec. In some embodiments, a voltage peak amplitude of the direct current pulse ranges from 0.3 V to 3 V. In some embodiments, the applying the alternating current signal excites a spin of a free layer of the magnetic random access memory cell into ferromagnetic resonance, and the applying the direct current pulse causes the magnetic orientation of the free layer to change. In some embodiments, the alternating current signal is applied to a bit line, a word line, or a source line of a magnetic random access memory device.

Another embodiment of the present disclosure is a method of manufacturing a semiconductor device, including forming a magnetic random access memory device and testing the magnetic random access memory device to determine an optimum alternating current signal to be applied to the magnetic random access memory device. The testing includes applying an alternating current signal to a magnetic random access memory cell of the magnetic random access memory device having a first magnetic orientation, and applying a direct current pulse to the magnetic random access memory cell. A read current is applied to the magnetic random access memory cell to determine if a magnetic orientation of the magnetic random access memory cell has changed in response to applying the alternating current signal and the direct current pulse. In some embodiments, the alternating current signal is superimposed over the direct current pulse. In some embodiments, the frequency of the alternating current signal ranges from 1 GHz to 100 GHz. In some embodiments, a voltage peak amplitude of the alternating current signal ranges from 0.1 V to 1 V. In some embodiments, the applying an alternating current signal includes sweeping through a range of frequencies or voltages. In some embodiments, the direct current pulse is a rectangular pulse having a pulse length of 5 nsec to 250 nsec. In some embodiments, a voltage peak amplitude of the direct current pulse ranges from 0.3 V to 3 V.

Another embodiment of the disclosure is a method of writing to a magnetic random access memory cell in an array of magnetic random access memory cells including applying a first alternating current signal to one of a word line or source line of the magnetic random access memory cell in the array. A first frequency of the first alternating current signal is below a frequency threshold value for causing precession of a free layer of the random access memory cell. A second alternating current signal to applying another of the word line or source line of the magnetic random access memory cell. A second frequency of the second alternating current signal is below the frequency threshold value for causing precession of the free layer of the random access memory cell. A combined frequency of the first frequency and the second frequency is greater than a threshold value for causing precession of the free layer of the random access memory cell. A direct current pulse is applied to the random access memory cell while applying the first alternating current signal and the second alternating current signal to the magnetic random access memory cell thereby changing the magnetic orientation of the magnetic random access memory cell. In some embodiments, in the array the magnetic orientation is only changed for the magnetic random access memory cell to which the first alternating current signal and the second alternating current signal are applied. In some embodiments, the combined frequency of the first frequency and the second frequency ranges from 1 GHz to 100 GHz. In some embodiments, a combined voltage peak amplitude of the first alternating current signal and the second alternating current signal ranges from 0.1 V to 1 V.

Another embodiment of the disclosure is a circuit for writing to a magnetic random access memory cell includes a driver configured to apply a direct current pulse to the random access memory cell, and an alternating current source configured to apply an alternating current signal to the random access memory cell. In some embodiments, the driver is a bit line driver, a source line driver, or a word line driver configured to apply the direct current pulse to a bit line, a source line, or a word line of the random access memory cell, respectively. In some embodiments, the alternating current source is configured to apply the alternating current signal to a same bit line, a source line, or a word line of the random access memory cell as the direct current pulse. In some embodiments, the circuit includes a word line decoder, a word line driver, and a bit line decoder and a bit line driver or a source line decoder and a source line driver. In some embodiments, the driver is a pulse generator. In some embodiments, the pulse generator is a rectangular pulse generator. In some embodiments, the pulse generator is configured to provide direct current pulses have a voltage peak amplitude ranging from 0.3 V to 3 V. In some embodiments, the pulse generator is configured to provide direct current pulses having a pulse length of 5 nsec to 250 nsec. In some embodiments, the alternating current source is configured to provide a current signal having a frequency of 1 GHz to 100 GHz. In some embodiments, the alternating current source is configured to provide a voltage peak amplitude of the alternating current signal ranging from 0.1 V to 1 V.

Another embodiment of the disclosure is a circuit for writing to an array of magnetic random access memory cells including a driver configured to apply a direct current pulse to a random access memory cell, and an alternating current source configured to apply an alternating current signal to the random access memory cell. In some embodiments, the driver is a bit line driver, a source line driver, or a word line driver configured to apply the direct current pulse to a bit line, a source line, or a word line of the random access memory cell, respectively. In some embodiments, the alternating current source is configured to apply the alternating current signal to a same bit line, a source line, or a word line of the random access memory cell as the direct current pulse. In some embodiments, the circuit includes a word line decoder, a word line driver, and a bit line decoder and a bit line driver or a source line decoder and a source line driver. In some embodiments, the driver is a pulse generator.

Another embodiment of the disclosure is a circuit for writing to an array of magnetic random access memory cells including a driver configured to apply a direct current pulse to a random access memory cell. A first alternating current source is configured to apply a first alternating current signal to one of a word line, bit line, or source line of a magnetic random access memory cell in the array. A second alternating current source is configured to apply a second alternating current signal to another of the word line, bit line, or source line of the magnetic random access memory cell. In some embodiments, the driver is a pulse generator. In some embodiments, the pulse generator is a rectangular pulse generator. In some embodiments, the pulse generator is configured to provide direct current pulses have a voltage peak amplitude ranging from 0.3 V to 3 V. In some embodiments, the first alternating current source and the second alternating current source are configured to provide a combined current signal having a frequency of 1 GHz to 100 GHz.

It will be understood that not all advantages have been necessarily discussed herein, no particular advantage is required for all embodiments or examples, and other embodiments or examples may offer different advantages.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of writing to a magnetic random access memory cell, comprising:
    applying an alternating current signal to the magnetic random access memory cell having a first magnetic orientation; and
    applying a direct current pulse to the magnetic random access memory cell to change the magnetic orientation of the magnetic random access memory cell from the first magnetic orientation to a second magnetic orientation,
    wherein the first magnetic orientation and the second magnetic orientation are different.

2. The method according to claim 1, wherein the alternating current signal is superimposed over the direct current pulse.

3. The method according to claim 1, wherein the frequency of the alternating current signal ranges from 1 GHz to 100 GHz.

4. The method according to claim 1, wherein a voltage peak amplitude of the alternating current signal ranges from 0.1 V to 1 V.

5. The method according to claim 1, wherein the applying an alternating current signal includes sweeping through a range of frequencies or voltages.

6. The method according to claim 1, wherein the direct current pulse is a rectangular pulse having a pulse length of 5 to 250 nsec.

7. The method according to claim 1, wherein a voltage peak amplitude of the direct current pulse ranges from 0.3 V to 3 V.

8. The method according to claim 1, wherein the applying the alternating current signal excites a spin of a free layer of the magnetic random access memory cell into ferromagnetic resonance, and the applying the direct current pulse causes the magnetic orientation of the free layer to change.

9. The method according to claim 1, wherein the alternating current signal is applied to a bit line, a word line, or a source line of a magnetic random access memory device.

10. A method of manufacturing a semiconductor device, comprising:
    forming a magnetic random access memory device; and
    testing the magnetic random access memory device to determine an optimum alternating current signal to be applied to the magnetic random access memory device, wherein the testing comprises:
        applying an alternating current signal to a magnetic random access memory cell of the magnetic random access memory device having a first magnetic orientation;
        applying a direct current pulse to the magnetic random access memory cell; and
        applying a read current to the magnetic random access memory cell to determine if a magnetic orientation of the magnetic random access memory cell has changed in response to applying the alternating current signal and the direct current pulse.

11. The method according to claim 10, wherein the alternating current signal is superimposed over the direct current pulse.

12. The method according to claim 10, wherein the frequency of the alternating current signal ranges from 1 GHz to 100 GHz.

13. The method according to claim 10, wherein a voltage peak amplitude of the alternating current signal ranges from 0.1 V to 1 V.

14. The method according to claim 10, wherein the applying an alternating current signal includes sweeping through a range of frequencies or voltages.

15. The method according to claim 10, wherein the direct current pulse is a rectangular pulse having a pulse length of 5 to 250 nsec.

16. The method according to claim 10, wherein a voltage peak amplitude of the direct current pulse ranges from 0.3 V to 3 V.

17. A circuit for writing to a magnetic random access memory cell, comprising:
   a driver configured to apply a direct current pulse to the random access memory cell; and an alternating current source configured to apply an alternating current signal to the random access memory cell.

18. The circuit of claim 17, wherein the driver is a bit line driver, a source line driver, or a word line driver configured to apply the direct current pulse to a bit line, a source line, or a word line of the random access memory cell, respectively.

19. The circuit of claim 18, wherein the alternating current source is configured to apply the alternating current signal to a same bit line, a source line, or a word line of the random access memory cell as the direct current pulse.

20. The circuit of claim 17, further comprising:
   a word line decoder;
   a word line driver; and
   a bit line decoder and a bit line driver or source line decoder and source line driver.

\* \* \* \* \*